(12) United States Patent
Wang et al.

(10) Patent No.: US 11,316,541 B2
(45) Date of Patent: Apr. 26, 2022

(54) LOW-DENSITY PARITY-CHECK (LDCP) DECODER OF RECONSTRUCTION-COMPUTATION-QUANTIZATION (RCQ) APPROACH FOR A STORAGE DEVICE

(71) Applicant: Samsung Electronics Co., Ltd., Suwon-si (KR)

(72) Inventors: Linfang Wang, Los Angeles, CA (US); Rekha Pitchumani, Oak Hill, VA (US); Zongwang Li, Dublin, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/204,936

(22) Filed: Mar. 17, 2021

(65) Prior Publication Data
US 2022/0103187 A1    Mar. 31, 2022

Related U.S. Application Data

(60) Provisional application No. 63/128,841, filed on Dec. 21, 2020, provisional application No. 63/083,862, filed on Sep. 25, 2020.

(51) Int. Cl.
*H03M 13/00* (2006.01)
*H03M 13/11* (2006.01)

(52) U.S. Cl.
CPC .... *H03M 13/6577* (2013.01); *H03M 13/1117* (2013.01)

(58) Field of Classification Search
CPC ................................................. H03M 13/6577
See application file for complete search history.

(56) References Cited

U.S. PATENT DOCUMENTS

| 7,325,174 B2 | 1/2008 | Choi et al. | |
| 8,458,556 B2 | 6/2013 | Planjery et al. | |
| 2009/0319858 A1* | 12/2009 | Sharon | H03M 13/6588 714/752 |
| 2012/0033741 A1 | 2/2012 | Nassor et al. | |
| 2015/0263763 A1* | 9/2015 | Kim | H03M 13/3707 714/752 |

(Continued)

OTHER PUBLICATIONS

Wang, Linfang et al., "A Reconstruction-Computation-Quantization (RCQ) Approach to Node Operations in LDPC Decoding", arXiv:2005.07259v1 [eess.SP], May 14, 2020, 6 pages.

*Primary Examiner* — Joseph D Torres
(74) *Attorney, Agent, or Firm* — Renaissance IP Law Group LLP

(57) ABSTRACT

A device is disclosed. The device may include an input buffer to receive a first low bit width message. A reconstruction circuit may implement a reconstruction function on the first low bit width message, producing a first high bit width message. A computation circuit may implementing a computation function on the first high bit width message, producing a second high bit width message. A quantization circuit may implementing a quantization function on the second high bit width message, producing a second low bit width message. A decision buffer may then store the second low bit width message. The reconstruction function and the quantization function may vary depending on an iteration and a layer of the device.

20 Claims, 11 Drawing Sheets

(56) References Cited

U.S. PATENT DOCUMENTS

| | | | |
|---|---|---|---|
| 2015/0349801 A1* | 12/2015 | Park | ................ H03M 13/6583 |
| | | | 714/752 |
| 2018/0159555 A1* | 6/2018 | Ryabinin | .......... H03M 13/6577 |
| 2018/0287637 A1 | 10/2018 | Liu et al. | |
| 2019/0319637 A1 | 10/2019 | Anderson et al. | |
| 2020/0296376 A1 | 9/2020 | Lim et al. | |

* cited by examiner

LOW-DENSITY PARITY-CHECK (LDCP) DECODER OF RECONSTRUCTION-COMPUTATION-QUANTIZATION (RCQ) APPROACH FOR A STORAGE DEVICE

RELATED APPLICATION DATA

This application claims the benefit of U.S. Provisional Patent Application Ser. No. 63/083,862, filed Sep. 25, 2020, and of U.S. Provisional Patent Application Ser. No. 63/128,841, filed Dec. 21, 2020, both of which are incorporated by reference herein for all purposes.

FIELD

The disclosure relates generally to storage devices, and more particularly to improved estimation of codewords.

BACKGROUND

Estimation of information bits from the encoded codewords stored in storage devices, which is also called decoding, may be difficult to calculate. Dedicated circuits for decoding may use resources that might be better used for other purposes. But with limited resources assigned to a decoder, the performance of a decoder may be degraded—that is, the decoder may take more time for estimation—which may slow down other processes within the storage device that may depend on such codewords. Limited resources allocated to decoding may also result in the decoder inaccurately estimating the original information bits: i.e., more decoding failures.

A need remains to decode information more quickly and more accurately without requiring significant additional resources.

BRIEF DESCRIPTION OF THE DRAWINGS

The drawings described below are examples of how embodiments of the disclosure may be implemented, and are not intended to limit embodiments of the disclosure. Individual embodiments of the disclosure may include elements not shown in particular figures and/or may omit elements shown in particular figures. The drawings are intended to provide illustration and may not be to scale.

SUMMARY

Figure 1:
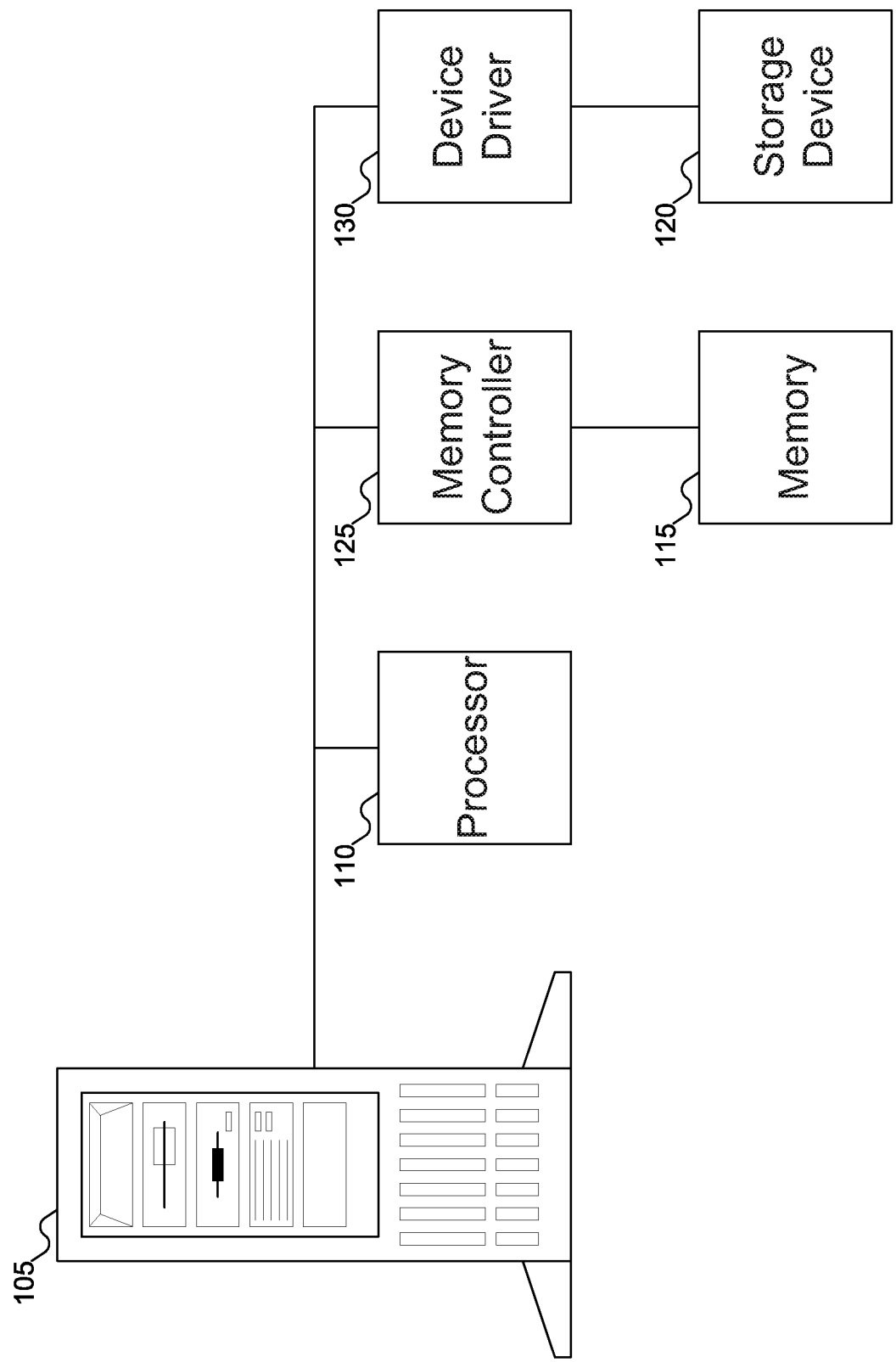
FIG. 1 shows a system including a storage device that may use a Reconstruction-Computation-Quantization (RCQ) approach in a Quasi-Cyclic Low-Density Parity-Check (QC-LDPC) decoder, according to embodiments of the disclosure.

Embodiments of the disclosure include a Low-Density Parity-Check (LDPC) decoder. The LDPC decoder may use a Reconstruction-Computation-Quantization (RCQ) approach, with each layer in the decoder potentially implementing different reconstruction and quantization functions. In this manner, improved decoder performance may be achieved.

DETAILED DESCRIPTION

Reference will now be made in detail to embodiments of the disclosure, examples of which are illustrated in the accompanying drawings. In the following detailed description, numerous specific details are set forth to enable a thorough understanding of the disclosure. It should be understood, however, that persons having ordinary skill in the art may practice the disclosure without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the disclosure.

The terminology used in the description of the disclosure herein is for the purpose of describing particular embodiments only and is not intended to be limiting of the disclosure. As used in the description of the disclosure and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Quasi-Cyclic Low-Density Parity-Check (QC-LDPC) codes are a family of structured Low-Density Parity-Check (LDPC) codes, themselves a variety of linear block codes, characterized by a parity check matrix H which consists of square sub-matrices that are either the zero matrix or cyclic permutation of the identity matrix (also called a circulant). A QC-LDPC code may be used in a Solid State Drive (SSD) or other storage device because a QC-LDPC code may reduce data processing latency and boost throughput.

A QC-LDPC code may be expressed in a compact way by a U×W matrix $H_p$. Each element in $H_p$ is either 0 or $\sigma^i$, which denote the zero matrix and the circulant that is cyclic shifted by i. If the size of square sub-matrix is m×m, then Equation (1) should hold:

$$m = \frac{N}{U} = \frac{N-k}{W} \qquad \text{Equation (1)}$$

Unlike flooding scheduled decoding, layered decoding may take advantage of the message having been updated, and therefore may converge faster. One implementation of layered decoding is horizontal layered decoding. QC-LDPC code may be compatible with horizontal layered decoding by partitioning check nodes into U consecutive groups. Using QC-LDPC with horizontal layered decoding may result in each variable node connecting with at most one check node in each layer.

A Minimum Sum (MinSum) decoder is a low complexity decoder of QC-LDPC code that may be used. In the $i^{th}$ iteration, a horizontal layered MinSum decoder may update the soft information of variable node h that connects with check node l by:

$$S \leftarrow Q_h - r_{c_l \to v_h}^{j-1} \qquad \text{Equation (2)}$$

$$r_{c_l \to v_h}^{j} \leftarrow \min_{t \in NC(l)/\{h\}} |S_t| \prod_{t \in NC(l)/\{h\}} \text{sign}(S_t) \qquad \text{Equation (3)}$$

$$Q_h \leftarrow S_h + r_{c_l \to v_h}^{j} \qquad \text{Equation (4)}$$

As an alternative to a MinSum decoder, a Reconstruction-Computation-Quantization (RCQ) decoder may be used for both variable node and check node operation. The decoder may contain three parts:

1. Reconstruction function $R(\cdot):R(\cdot)$ may receive a low-bit external message $u_i$ from its connected node and map $u_i$ to an internal high-bit message $r_i$.

2. Computation function $F(\cdot):F(\cdot)$ may compute high-bit output $r_{out}$ from the high-bit messages $r_i$.

3. Quantization function $Q(\cdot):Q(\cdot)$ may quantize $r_{out}$ into a low-bit external message $u_{out}$ and pass $u_{out}$ to connected node.

If the computation module implements belief propagation, such a decoder may be termed a belief propagation RCQ (bpRCQ); if the computation module implements MinSum, such a decoder may be termed a MinSum RCQ (msRCQ). A three tuple ($z^e$, $z^c$, $z^v$), which contains the precision of the external message, the internal message of the check node, and the internal message of the variable node, may be used to describe the precision of the RCQ decoder. Finally, ∞ may be used to represent floating point arithmetic.

In contrast to an RCQ decoder, a layered RCQ (L-RCQ) decoder may be described. The structure of an L-RCQ decoder may differ from the basic structure of an RCQ decoder in that the functions $R_v^i(\cdot)$ and $Q_v^i(\cdot)$ may be layer- and iteration-specific. $Q_v^{(l,i)}(\cdot)$ may be used to represent the variable node quantization function of layer l in iteration i; $R_v^{(l,i)}(\cdot)$ may be similarly understood to represent the variable node reconstruction function of layer l in iteration i. Layer-specific parameters of an L-RCQ decoder may be selected so that the probability density of the outcoming message from each layer may be tracked.

In order to construct parameters for each layer in an L-msRCQ decoder, the probability density function (p.d.f.) of outcoming messages in each layer should be known. A layered mutual-information-maximization discrete density evolution (L-MIM-DDE) may be used for this purpose. In L-MIM-DDE the joint probability between a code bit and an outcoming message T from a check node and a variable node may be tracked in each iteration. $p_c^{(l,i)}(X,T)$, $X=\{0,1\}$, $T=\{0, \ldots, 2^n-1\}$ may be used to represent the check node outcoming message probability distribution of layer l in iteration i. Similarly, $p_v^{(l,i)}(X,T)$ may be used to represent the variable node outcoming message probability distribution of layer l in iteration i.

If the layer size is equal to the lifting size m, L-MIM-DDE may be computed via $H_p$. Layer l may be equivalent to check node l in $H_p$. The degree of check node l may be denoted by $d_{c_l}$.

The L-MIM-DDE may be implemented using an Additive White Gaussian Noise (AWGN) channel. Hierarchical dynamic quantization (HDQ) may be used to realize MIM quantization of channel observations. $p_{ch}(X,T)$, $X=\{0,1\}$, $T=\{0, \ldots, 2_n-1\}$ may be used to represent the quantized channel probability distribution.

In iteration i and layer l, the probability distribution of outcoming messages from variable node $h \in NC(l)$ may be calculated as:

$$p_v^{(l,i,h)}(X, T) = \qquad \text{Equation (5)}$$
$$p_{ch}(XT) \boxdot \left( \boxdot_{\substack{k \in NC(l) \\ k<l}} p_c^{(k,i)}(X, T) \right) \boxdot \left( \boxdot_{\substack{k \in NC(l) \\ k>l}} p_c^{(k,i-1)}(X, T) \right)$$

The binary operator $\boxdot$ may be used to calculate the log-likelihood ratio (LLR) summation of two input messages:

$$p_c^{l_1}(X, T) \boxdot p_c^{l_2}(X, T) = \frac{1}{p(X)} p_c^{l_1}(X, T) p_c^{l_2}(X, T) \qquad \text{Equation (6)}$$

Equation (6) does not assume that all incoming messages from different layers have the same probability. On the contrary, Equation (6) may utilize the updated messages in a timely manner: when k<l, Equation (6) may utilize the updated message and when k>l Equation (6) may use the old message. Thus, Equation (6) may address information mismatch problems.

As an L-RCQ decoder may use layer-specific RCQ parameters, all messages assigned to different variable nodes connected to same layer may have the same probability distribution. $p_v^{(l,i,h)}(X,T)$ may then be computed as:

$$\tilde{p}_v^{(l,i)} = \left\{ \frac{1}{d_c} p_v^{(l,i,h)}(X, T) \,\Big|\, k \in NC(l) \right\} \qquad \text{Equation (7)}$$

Finally, HDQ to quantize $\tilde{p}_v^{(l,i)}$, $p_v^{(l,i)}(X,T)$ and $Q_v^i(\cdot)$ may be computed as:

$$[p_v^{(l,i)}(X,T), Q_v^i(\cdot)] = HDQ(\tilde{p}_v^{(l,i)}, 2^n) \quad \text{Equation (8)}$$

Since L-MIM-DDE may be implemented using a symmetric AWGN channel. If $l_v^{(l,i)}(t)$ is used to represent the LLR of the messages t from a variable node connected to layer l in iteration i, then $l_v^{(l,i)}(t)$ may be computed as:

$$l_v^{(l,i)}(t) = \log \frac{p_v^{(l,i)}(0 \mid t)}{p_v^{(l,i)}(1 \mid t)} \quad \text{Equation (9)}$$

Due to the symmetry, $p_v^{(l,i)}(X,T)$ has the following properties:
 monotonic increasing: $l_v^{(l,i)}(t_1) > l_v^{(l,i)}(t_2)$, when $t_1 > t_2$;
 symmetry: $l_v^{(l,i)}(t_1) = -l_v^{(l,i)}(2^m - 1 - t_2)$.

Based on the above two properties, the MinSum operation may be implemented with respect to their labels:

$$MS(t_1, t_2) = l^{-1}[\min(|l(t_1)|, |l(t_2)|) \cdot \text{sgn}(l(t_1)) \cdot \text{sgn}(l(t_1))] \quad \text{Equation (10)}$$

where $l^{-1}(m)$ identifies the label whose LLR is m.

Since all messages from different variable nodes in each layer are assumed to have the same probability density, $p_c^{(l,i)}(X,T)$ may be calculated as:

$$p_c^{(l,i)}(X,T) = p_v^{(l,i)}(X,T) \circledast \ldots \circledast p_v^{(l,i)}(X,T) \triangleq p_v^{(l,i)}(X,T)^{\circledast (d_c - 1)} \quad \text{Equation (11)}$$

For the msRCQ decoder:

$$p_v^a(X,T) \circledast * p_v^b(X,T) \triangleq \sum_{m,n:MS(m,n)=k} p^{(v,a)}(X_m, T) p^{(v,b)}(X_n, T) \quad \text{Equation (12)}$$

Since Equation (12) does not increase the cardinality of output message, $p_c^{(l,i)}$ and $R_v^{(l,i)}(\cdot)$ may be derived. An example of pseudocode for L-MIM-DDE is shown below. The one step annealing (OSA) algorithm may be a coarse quantization algorithm that reduces the computation required for HDQ.

---

Algorithm 1

Input: $H_p$, $\sigma^2$, $\in$, $z^e$
Output: $Q^{ch}(\cdot)$, $R^{ch}(\cdot)$, $Q_v^{(l,i)}(\cdot)$, $R_v^{(l,i)}(\cdot)$
$p_c^{(l,i)}(X,T) \leftarrow$ uniform.quan($p(x, y|\sigma^2)$)
$[p_c^{(l,i)}(X,T), Q^{ch}(\cdot), R^{ch}(\cdot)] \leftarrow HDQ(P^{ch}(X,Y), 2^m)$,
$p^{(l,0)}(X,T) \leftarrow P^{ch}(X,T)$ l = {1, ... , U}
for i ← 1 to $I_T$ do
 for l ← 1 to U do
  Compute $\tilde{p}_v^{(l,i)}$ using Equation (8) and Equation (9)
  $\tilde{p}^{(l,i)} \leftarrow OSA(\tilde{p}^{(l,i)}, \in)$
  $[p_v^{(l,i)}(X,T), Q_v^{(l,i)}(\cdot)] \leftarrow HDQ(\tilde{p}_v^{(l,i)}, 2^{z^e})$
  Compute $p_c^{(l,i)}(X,T)$ and $R_v^{(l,i)}(\cdot)$ using Equation (12)
 end
end

---

In one implementation of the code, the following properties may be used: n=37632, r=0.8707, m=128 and $I_T$=20. 5 bits L-msRCQ may be compared with 5 bits msRCQ, BP, and a fixed point offset MinSum decoder. All the decoders may be implemented with horizontal layered schedule with layer size 128.

5 bits L-msRCQ appears to perform better than 5 bits msRCQ and 10 bits Offset MinSum. Except for error correction performance, L-msRCQ appears to have a lower average iteration time than msRCQ. The average iteration time of the L-msRCQ decoder with belief propagation is comparable to the average iteration time of the 10 bits offset MinSum when $$\frac{E_b}{N_o}$$

gets high. Both the better Frame Error Rate (FER) and lower average iteration time of L-msRCQ may be a matter of layered msRCQ parameter design, which tracks the probability density of message in each layer. Finally, Table 1 may summarize the FER and average iteration time for the three decoders, and appears to show that L-RCQ decoder has the best performance among these three decoders.

TABLE 1

Performance Comparison between Investigated Decoders

|  | Offset MinSum | RCQ | L-RCQ |
|---|---|---|---|
| Bit Width | 10 | 5 | 5 |
| Average Iteration Time | 7.5 | 12.5 | 7.5 |

FIG. 1 shows a system including a storage device that may use a Reconstruction-Computation-Quantization (RCQ) approach in a Quasi-Cyclic Low-Density Parity-Check (LDPC) decoder, according to embodiments of the disclosure. In FIG. 1, machine 105 may include processor 110, memory 115, and storage device 120. Processor 110 may be any variety of processor. (Processor 110, along with the other components discussed below, are shown outside the machine for ease of illustration: embodiments of the disclosure may include these components within the machine.) While FIG. 1 shows a single processor 110, machine 105 may include any number of processors, each of which may be single core or multi-core processors, each of which may implement a Reduced Instruction Set Computer (RISC) architecture or a Complex Instruction Set Computer (CISC) architecture (among other possibilities), and may be mixed in any desired combination.

Processor 110 may be coupled to memory 115. Memory 115 may be any variety of memory, such as flash memory, Dynamic Random Access Memory (DRAM), Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM) etc. Memory 115 may also be any desired combination of different memory types, and may be managed by memory controller 125. Memory 115 may be used to store data that may be termed "short-term": that is, data not expected to be stored for extended periods of time. Examples of short-term data may include temporary files, data being used locally by applications (which may have been copied from other storage locations), and the like.

Processor 110 and memory 115 may also support an operating system under which various applications may be running. These applications may issue requests (which may also be termed commands) to read data from or write data to either memory 115 or storage device 120. Storage device 120 may be used, for example, to store initial parameters (or ranges of values for initial parameters, along with what types of behaviors the ranges of values represent) used to initialize the simulation. Storage device 120 may be accessed using device driver 130. While FIG. 1 uses the generic term "storage device", embodiments of the disclosure may include any storage device formats that may utilize a Low-Density Parity-Check (LDPC) decoder using a Reconstruction-Computation-Quantization (RCQ) approach, examples of which may include hard disk drives and Solid State Drives (SSDs). Any reference to "SSD" below should be understood to include such other embodiments of the disclosure.

Figure 2:
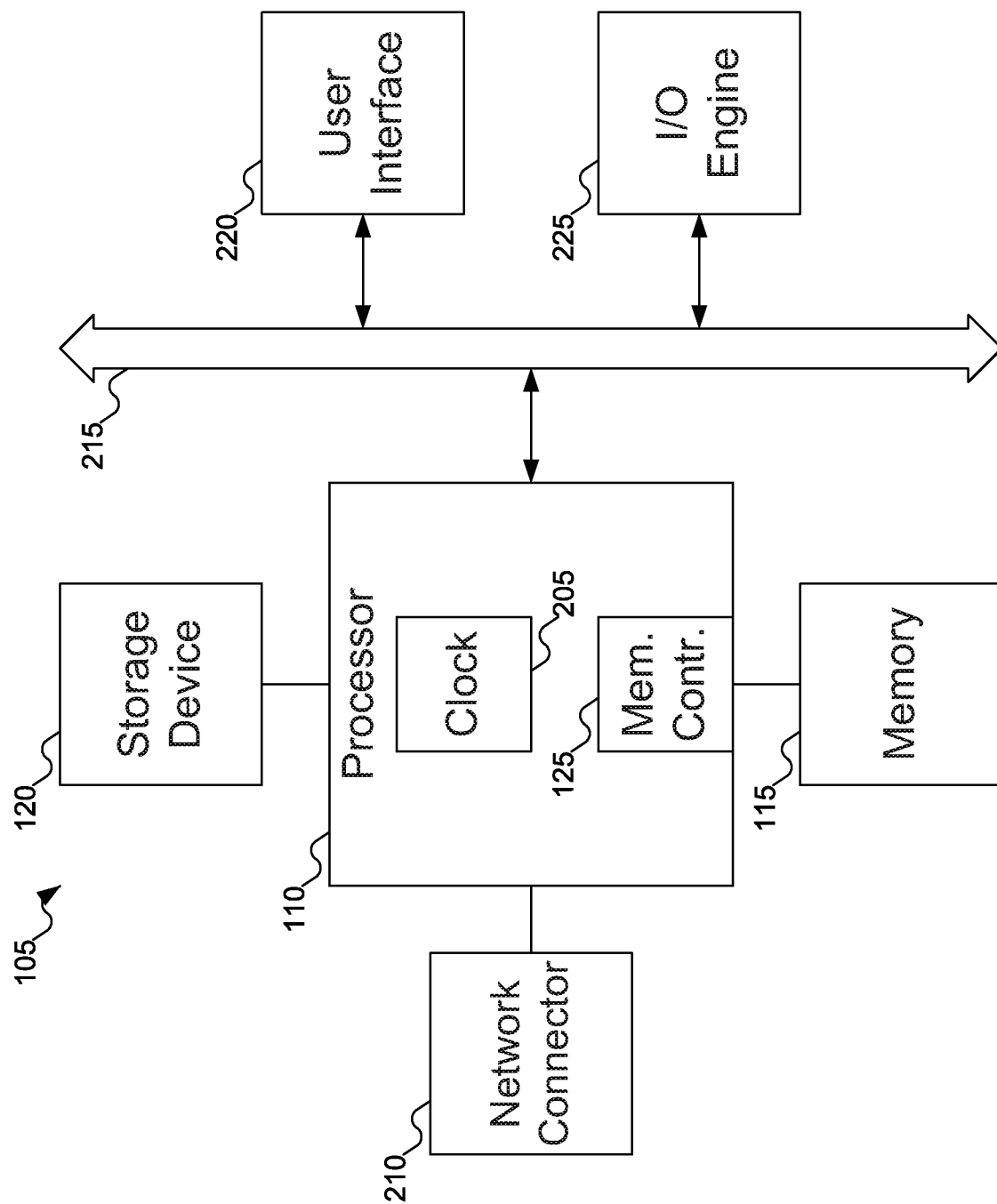
FIG. 2 shows details of the machine of FIG. 1, according to embodiments of the disclosure.

FIG. 2 shows details of machine 105 of FIG. 1, according to embodiments of the disclosure. In FIG. 2, typically, machine 105 includes one or more processors 110, which may include memory controllers 125 and clocks 205, which may be used to coordinate the operations of the components of the machine. Processors 110 may also be coupled to memories 115, which may include random access memory (RAM), read-only memory (ROM), or other state preserving media, as examples. Processors 110 may also be coupled to storage devices 120, and to network connector 210, which may be, for example, an Ethernet connector or a wireless connector. Processors 110 may also be connected to buses 215, to which may be attached user interfaces 220 and Input/Output (I/O) interface ports that may be managed using I/O engines 225, among other components.

Figure 3:
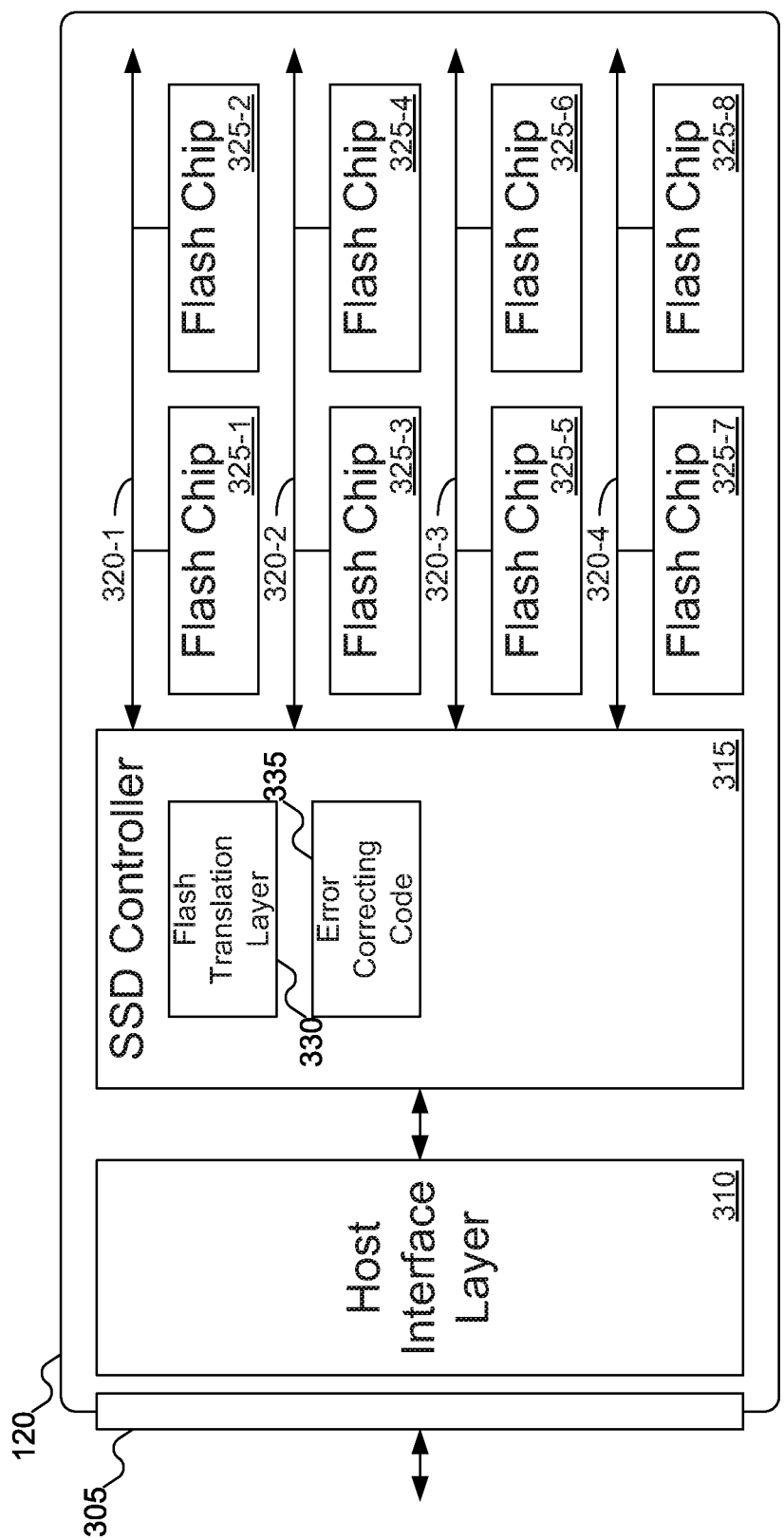
FIG. 3 shows details of the storage device of FIG. 1 when implemented as a Solid State Drive (SSD), according to embodiments of the disclosure.

FIG. 3 shows details of storage device 120 of FIG. 1 when implemented as an SSD, according to embodiments of the disclosure. In FIG. 3, SSD 120 may include interface 305.

Interface 305 may be an interface used to connect SSD 120 to machine 105 of FIG. 1. SSD 120 may include more than one interface 305: for example, one interface might be used for block-based read and write requests, and another interface might be used for key-value read and write requests. While FIG. 3 suggests that interface 305 is a physical connection between SSD 120 and machine 105 of FIG. 1, interface 305 may also represent protocol differences that may be used across a common physical interface. For example, SSD 120 might be connected to machine 105 using a U.2 or an M.2 connector, but may support block-based requests and key-value requests: handling the different types of requests may be performed by a different interface 305.

SSD 120 may also include host interface layer 310, which may manage interface 305. If SSD 120 includes more than one interface 305, a single host interface layer 310 may manage all interfaces, SSD 120 may include a host interface layer for each interface, or some combination thereof may be used.

SSD 120 may also include SSD controller 315, various channels 320-1, 320-2, 320-3, and 320-4, along which various flash memory chips 325-1, 325-2, 325-3, 325-4, 325-3, 325-6, 325-7, and 325-8 may be arrayed. SSD controller 315 may manage sending read requests and write requests to flash memory chips 325-1 through 325-8 along channels 320-1 through 320-4. Although FIG. 3 shows four channels and eight flash memory chips, embodiments of the disclosure may include any number (one or more, without bound) of channels including any number (one or more, without bound) of flash memory chips.

Within each flash memory chip, the space may be organized into blocks, which may be further subdivided into pages, and which may be grouped into superblocks. The page is typically the smallest unit of data that may be read or written on an SSD. Page sizes may vary as desired: for example, a page may be 4 KB of data. If less than a full page is to be written, the excess space is "unused".

While pages may be written and read, SSDs typically do not permit data to be overwritten: that is, existing data may be not be replaced "in place" with new data. Instead, when data is to be updated, the new data is written to a new page on the SSD, and the original page is invalidated (marked ready for erasure). Thus, SSD pages typically have one of three states: free (ready to be written), valid (containing valid data), and invalid (no longer containing valid data, but not usable until erased) (the exact names for these states may vary).

But while pages may be written and read individually, the block is the basic unit of data that may be erased. That is, pages are not erased individually: all the pages in a block are typically erased at the same time. For example, if a block contains 256 pages, then all 256 pages in a block are erased at the same time. This arrangement may lead to some management issues for the SSD: if a block is selected for erasure that still contains some valid data, that valid data may need to be copied to a free page elsewhere on the SSD before the block may be erased. (In some embodiments of the disclosure, the unit of erasure may differ from the block: for example, it may be a superblock, which may be a set of multiple blocks.)

SSD controller 315 may include flash translation layer 330 (which may be termed more generally a logical-to-physical translation layer, for storage devices that do not use flash storage), and error correcting code 335. Flash translation layer 330 may handle translation of LBAs or other logical IDs (as used by processor 110 of FIG. 1) and physical block addresses (PBAs) or other physical addresses where data is stored in flash chips 325-1 through 325-8. Error correcting code 335 may apply (that is, establish and/or use) error correcting codes for data being written to and/or read from flash chips 325-1 through 325-8. While FIG. 3 shows one flash translation layer 330, embodiments of the disclosure may include any number (one or more, without bound) of flash translation layers 330. While FIG. 3 shows one error correcting code 335, embodiments of the disclosure may include any number (one or more, without bound) of error correcting codes 335.

Although direct computation of a codeword (or direct use of a codeword to perform error correction) is possible, implementing such functions in hardware may use significant resources (such as space on a printed circuit board within SSD 120 of FIG. 3). To reduce the resources required to implement error correction, other approaches may be used. One approach that may be used is an iterative approach. In an iterative approach, a problem is not solved directly (perhaps using a complicated formula) but instead solved sequentially (perhaps using a simple formula). For example, consider the problem of identifying a point where a complex curve crosses the x-axis (called an x-intercept). Although using algebra it may be possible to take the equation defining the curve and solve for where an x-intercept lies, teaching a computer or circuit to perform such a calculation may be exceedingly difficult. On the other hand, given the equation defining the function, it may be simple to compute $y=f(x)$. If the derivative of the function (denoted f') is also easily determined, then locating an x-intercept for the function $f(x)$ is easily defined:

1) Select a point $x_0$.
2) Compute the value $y_0=f(x_0)$.
3) Compute the value $y'_0=f'(x_0)$ (which represents the slope of the tangent line to the curve at the point $(x_0, y_0)$.
4) Using the values $x_0$, $y_0$, and $y'_0$, the line going through the point $(x_0, y_0)$ with the slope $y'_0$ may be calculated.
5) Find the x-intercept for the line just identified.

This process may then be repeated, substituting the most recently determined x-intercept for the point $x_0$. Hopefully, each iteration of this sequence will result in a point on the curve that is closer to an x-intercept of the curve.

This process is said to converge if the distance points located in successive iterations of the sequence eventually get close enough (within some amount, often labeled Λ or ε) that the answers are considered effectively equivalent. Note that the circuitry involved in calculating values for the function or its derivative, and for identifying a line going through a particular point with a particular slope, is relatively simple (and typically simpler than the circuitry involved in calculating a direct solution to the problem). Thus, the problem of finding an x-intercept for a curve may be solved using fewer resources than attempting a direct solution of the problem. The tradeoff is that whereas a direct solution might identify the x-intercept immediately, using an iterative approach such as that described above may require any number of iterations before the sequence converges on a solution (if, in fact, the sequence even converges at all), and thus may take more time.

In the same way, using an iterative approach to decoding a codeword may use fewer resources, but may require a number of iterations to complete the computation (that is, for the decoder to identify a solution. Using an iterative approach, fewer resources—fewer circuits and/or a lower bit width for data—may be used in decoding the codeword.

But when using an iterative approach instead of a direct approach, additional considerations may arise. The first consideration may be the number of iterations needed to solve the problem. The number of iterations may not necessarily be predictable: that is, the number of iterations may depend on the problem being solved. Considering again the iterative solution to find an x-intercept for a curve, if each iteration is only a marginal improvement over the previous iteration as an approximation of the x-intercept, many iterations may be needed, whereas if the curve approximates a straight line the x-intercept may be located quickly. The second consideration is the time needed to complete an iteration of the solution. For example, if a single iteration of one algorithm would take, say, 10 seconds and a single iteration of another algorithm would take only, say, 1 second, then 10 iterations of the second algorithm may be completed in the same time as a single iteration of the first algorithm. An algorithm that has a smaller average iteration time may be superior to an algorithm that has a greater average iteration time.

Of course, it may be important to balance average iteration time with the resources used in implementing the iterative algorithm. In some implementations faster performance may be desired, whereas in other implementations fewer resources used may be desired.

Figure 4:
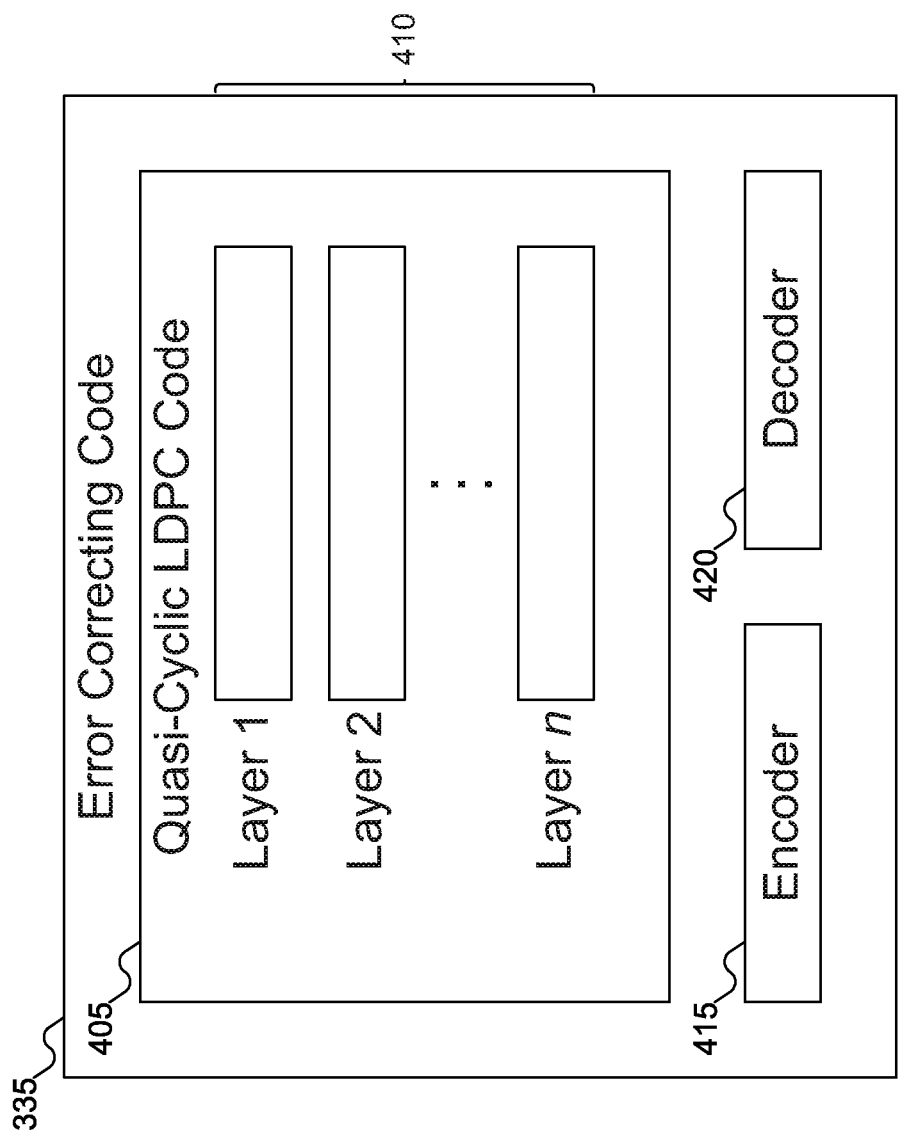
FIG. 4 shows the general layout of a QC-LDPC code in the SSD of FIG. 3, according to embodiments of the disclosure.

FIG. 4 shows the general layout of a QC-LDPC code in SSD 120 of FIG. 3, according to embodiments of the disclosure. In FIG. 4, error correcting code 335 is shown. Error correcting code 335 may include QC-LDPC 405. QC-LDPC may implement a number of layers, shown as layers 410. QC-LDPC 405 may include encoder 415 (used in generating an error correcting codeword) and decoder 420 (used in attempting to perform error correction using the error correcting codeword).

Layers, such as layers 410, represent a variation on the concept of iterations. Using layers 410, different functions may be used as part of the decoder (which may also be termed a device): the individual function(s) to be used may depend on the layer. An iteration, on the other hand, may represent a sequence using each layer 410 in a specified order. Thus, when discussing decoding of codewords using decoder 420, the approach may involve both iterations and layers.

Figure 5:
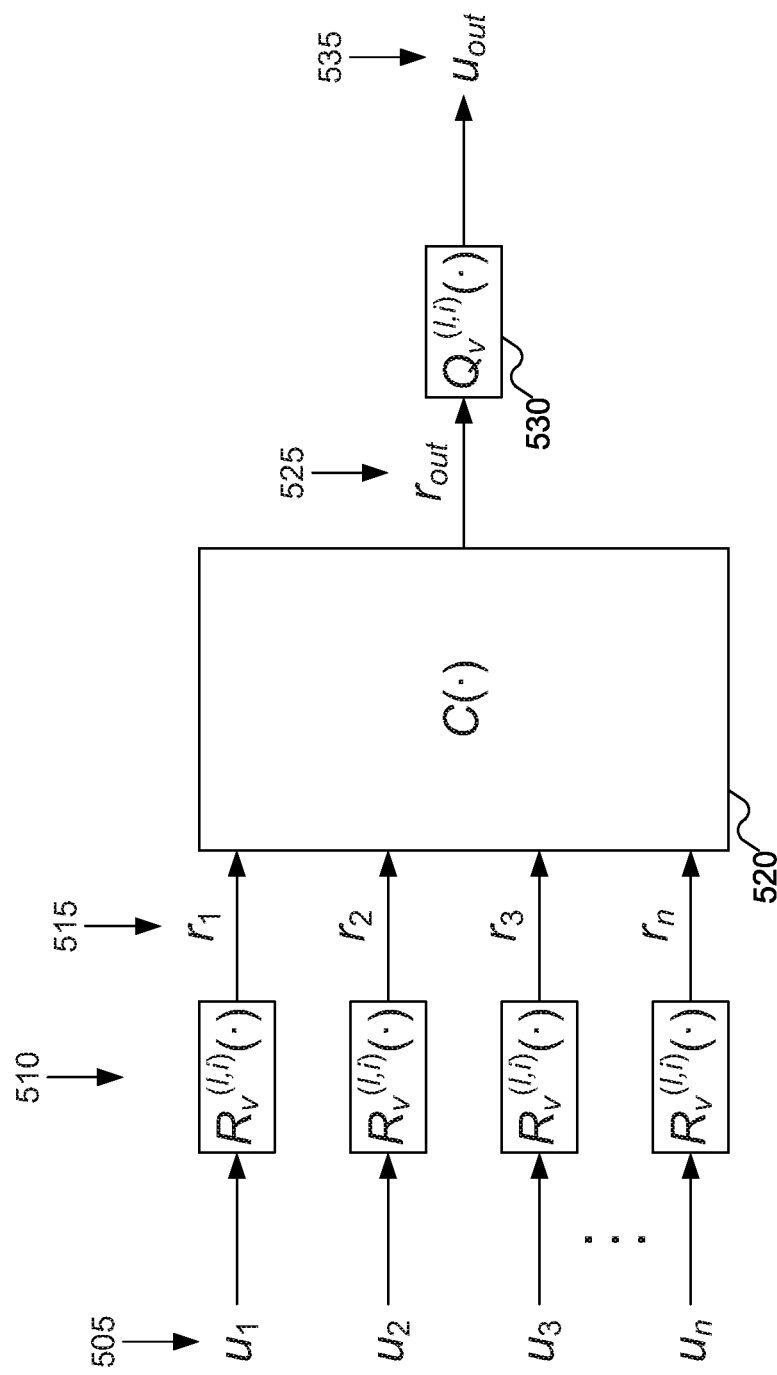
FIG. 5 shows the general layout of the RCQ approach in the QC-LDPC code in the SSD of FIG. 3, according to embodiments of the disclosure.

FIG. 5 shows the general layout of the RCQ approach in the QC-LDPC code in SSD 120 of FIG. 3, according to embodiments of the disclosure. In FIG. 5, various low bit width messages 505 may be input. Reconstruction circuit 510 may be applied to each of the input low bit width messages 505. (While FIG. 5 shows multiple copies of reconstruction circuit 510, in implementation there may be just one reconstruction circuit 510 which may be used repeatedly as needed for each input message 505, or there may be multiple reconstruction circuits 510, as desired.) Reconstruction circuit 510 may then produce high bit width message 515 for each input low bit width message 505.

The various high bit width messages 515 may be input to computation circuit 520. Computation circuit 520 (which may be implement a function described as $C(\cdot)$ or $F(\cdot)$, depending on the implementation, and which may also be described using other names) may then perform a function on high bit width messages 515. For example, computation circuit 520 may generate a sum of high bit width messages 515, or may implement a minimum function of high bit width messages 515. Embodiments of the disclosure may also implement other functions using computation circuit 520. Computation circuit 520 may then produce high bit width message 525.

Quantization circuit 530 may take high bit width message 525 and quantize high bit width message 525, to produce low bit width message 535.

In some embodiments of the disclosure, low bit width messages 505 and 535 may be 5 bits wide, and high bit width messages 515 and 525 may be 10 bits wide. But in other embodiments of the disclosure, low bit width messages 505 and 535 and high bit width messages 515 and 525 may have other bit widths. But in keeping with the general meaning of "low" and "high", some embodiments of the disclosure may have include low bit width messages 505 and 535 having fewer bits than high bit width messages 515 and 525 (although other embodiments of the disclosure may have more bits in low bit width messages 505 and 535 than in high bit width messages 515 and 525).

In FIG. 5, reconstruction circuit 510 is shown as implementing a function $R_v^{(l,i)}(\cdot)$, and quantization circuit 530 is shown as implementing a function $Q_v^{(l,i)}(\cdot)$. The subscript v may refer to the fact that decoder 420 of FIG. 4 may be implemented using two nodes: a variable node and a check node. In some embodiments of the disclosure, each node may perform its own reconstruction and quantization: thus, the subscript v may reflect the fact that reconstruction circuit 510 and quantization circuit 530 are shown for the variable node in decoder 420. However, reconstruction and quantization circuits for the check node may operate similarly (albeit using different functions for reconstruction and quantization).

The superscript (l, i) in functions $R_v^{(l,i)}(\cdot)$ and $Q_v^{(l,i)}(\cdot)$ may reflect the fact that the specific reconstruction and quantization functions may depend both on the iteration (i) and the layer (l) for which the function is being applied. In some embodiments of the disclosure, the functions $R_v^{(l,i)}(\cdot)$ and $Q_v^{(l,i)}(\cdot)$ may vary depending on the layer (but while each layer might use different functions, across iterations the functions may be the same for corresponding layers. In other words, for example, $R_v^{(1,1)}(\cdot)$ and $R_v^{(2,1)}(\cdot)$ may all different functions, but $R_v^{(1,1)}(\cdot)$ and $R_v^{(1,2)}(\cdot)$ may be the same function. In other embodiments of the disclosure, the functions $R_v^{(l,i)}(\cdot)$ and $Q_v^{(l,i)}(\cdot)$ may vary based on the layer being executed and the iteration of the sequence. In other words, for example, $R_v^{(1,1)}(\cdot)$, $R_v^{(1,2)}(\cdot)$, and $R_v^{(2,1)}(\cdot)$ may all be different functions.

The functions $R_v^{(l,i)}(\cdot)$ and $Q_v^{(l,i)}(\cdot)$ may be determined using any desired technique. In some embodiments of the disclosure, a layered mutual-information-maximization discrete density evolution (L-MIM-DDE), or more generally a density evolution, technique may be used to design the functions $R_v^{(l,i)}(\cdot)$ and $Q_v^{(l,i)}(\cdot)$, as described in Algorithm 1 above.

Figure 6:
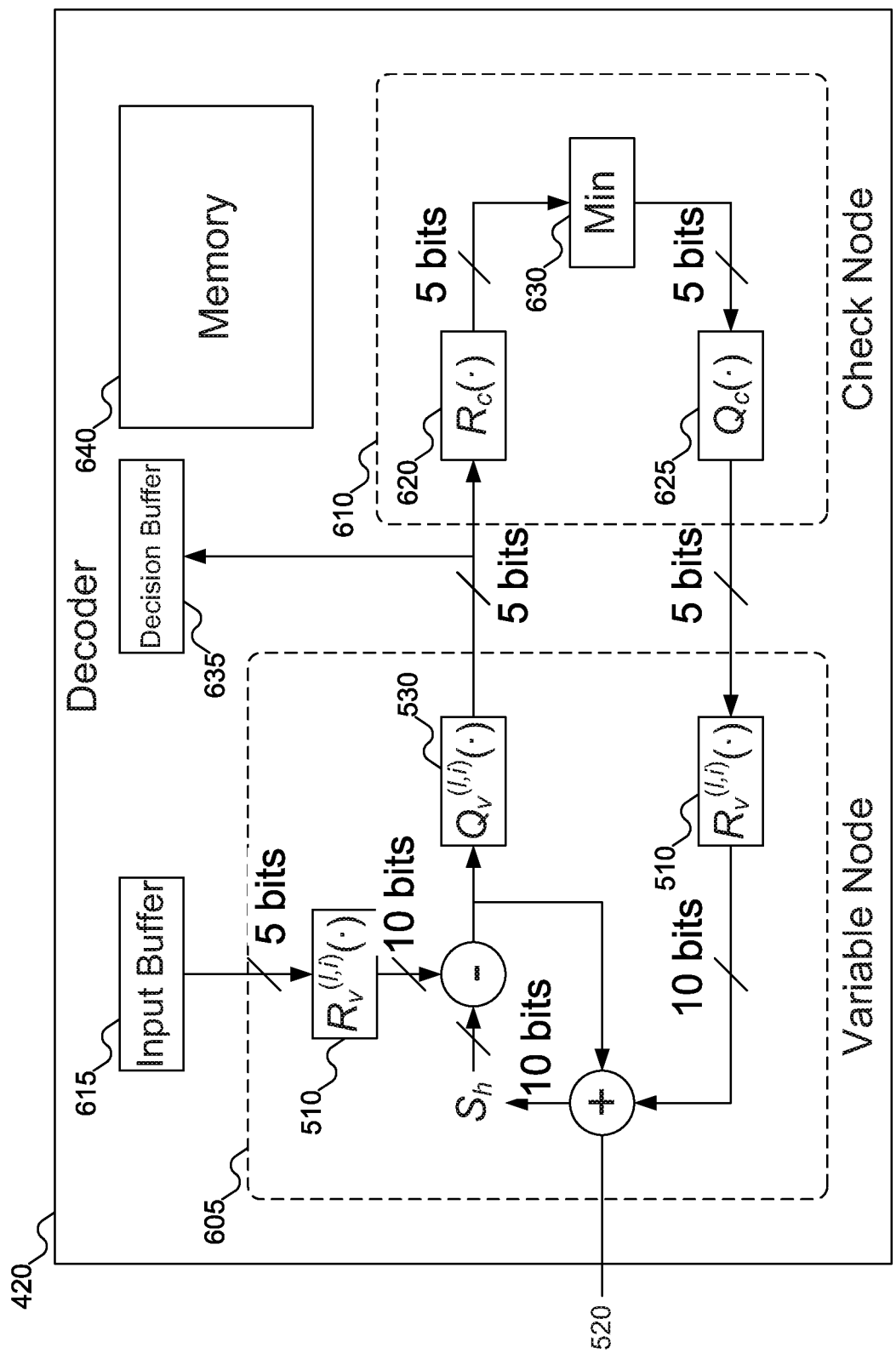
FIG. 6 shows an architecture for the decoder of FIG. 4, according to an embodiment of the disclosure.

FIG. 6 shows an architecture for decoder 420 of FIG. 4, according to an embodiment of the disclosure. In FIG. 4, decoder 420 may include variable node 605 and check node 610. Variable node 605 may perform the primary implementation of the RCQ approach, which check node 610 performing a check that the computation is being performed correctly.

Decoder 420 may include input buffer 615 to receive a low bit width message from, for example, QC-LDPC 405 of FIG. 4, with which to perform decoding. Then, variable node 605 may use reconstruction circuit 510, computation circuit 520 (shown in FIG. 6 as implementing an addition operation), and quantization circuit 530 to move between low bit width and high bit width messages and to perform computations on the high bit width messages.

Variable node 610 is shown as including $S_h$. $S_h$ may represent "soft" information regarding one or more encoded bits. In each iteration, $S_h$ may be used to make decisions regarding the encoded bit(s).

Check node 610 may include its own reconstruction circuit 620 and quantization circuit 625, along with computation circuit 630 (shown implementing a minimum function) to perform a computation on the high bit width message. Check node 610 typically operates on low bit width messages: reconstruction circuit 620 and quantization circuit 625 may map between a label message as used in variable node 605 and likelihood ratio (LLR) messages. But while FIG. 6 shows computation circuit 630 as using the same bit width as the low bit width messages in variable node 605, embodiments of the disclosure may include check node 610 using another bit width (such as the high bit width or yet another bit width).

Eventually, once the messages have converged to a solution, the output may be transmitted back to the requester (which may be, for example, QC-LDPC 405 of FIG. 4) using decision buffer 635 (from which, for example, the requester may read the decoded bits). This solution/decoded bits may be best approximation of the input data received by decoder 420. That is, given that the data received by decoder 420 may have errors, the output of decoder 420 may be the input data with errors corrected according to decoder 420.

Decoder 420 may also include memory 640. Memory 640 may be used to store the various functions $R_v^{(l,i)}(\cdot)$ and $Q_v^{(l,i)}(\cdot)$ used in different layers and different iterations of the function. Note that while FIG. 6 shows memory 640 as part of decoder 420, memory 640 may be somewhere else within SSD 120 of FIG. 3, or even memory 115 of FIG. 1.

While functions $R_v^{(l,i)}(\cdot)$ and $Q_v^{(l,i)}(\cdot)$ may be implemented as mathematical functions capable of operating on any possible input values, in some embodiments of the disclosure functions $R_v^{(l,i)}(\cdot)$ and $Q_v^{(l,i)}(\cdot)$ may be implemented as lookup tables. That is, given a particular low bit width message, function $R_v^{(l,i)}(\cdot)$ may store a corresponding high bit width message, and given a particular high bit width message, function $Q_v^{(l,i)}(\cdot)$ may store a corresponding low bit width message. As a result, functions $R_v^{(l,i)}(\cdot)$ and $Q_v^{(l,i)}(\cdot)$ may not be continuous functions, and might even not be defined for any input not listed in the lookup tables. These lookup tables may be stored in memory 640, as shown in FIG. 7.

Figure 7:
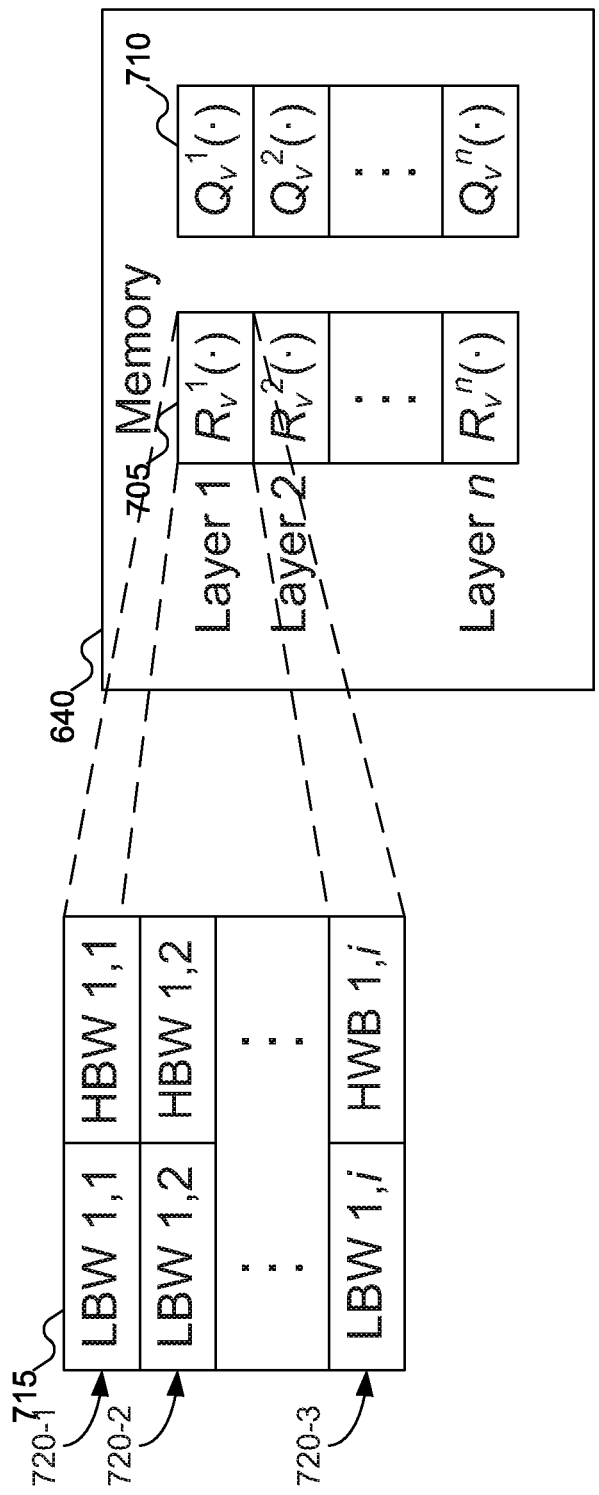
FIG. 7 shows the memory of FIG. 6 storing tables of reconstruction and quantization functions, according to an embodiment of the disclosure.

FIG. 7 shows memory 640 of FIG. 6 storing tables of reconstruction and quantization functions, according to an embodiment of the disclosure. In FIG. 7, tables 705 and 710 are shown. Table 705 stores reconstruction functions $R_v^{(l,i)}(\cdot)$; table 710 shows quantization functions $Q_v^{(l,i)}(\cdot)$.

In FIG. 7, the tables are organized in rows, with each row being for a layer. In some embodiments of the disclosure, the same function may be used for a particular layer across different iterations. In such embodiments of the disclosure, each entry in tables 605 and 610 may just be a definition of the appropriate function. But in other embodiments of the disclosure, different functions may be used not only in each layer but in each iteration. In such embodiments of the disclosure, each row in tables 605 and 610 actually includes a table for that layer. Thus, table 715 shows an expansion of the reconstruction function for layer 1. As can be seen, table 715 may show multiple entries, pairing a low bit width message with a high bit width message. For example, entry 720-1 pairs low bit width message 1,1 with high bit width message 1,1, entry 720-2 pairs low bit width message 1,2 with high bit width message 1,2, and entry 720-3 pairs low bit width message 1,i with high bit width message 1,i. In table 715, the identifier "1,1" may be understood to identify layer 1, iteration 1, the identifier "1,2" may be understood to identify layer 1, iteration 2, and the identifier "1,i" may be understood to identify layer 1, iteration 1,i. The entries for the quantization functions may be similarly managed.

While FIG. 7 suggests that tables 705 and 710 are stored organized by layers, embodiments of the disclosure may organize tables 705 and 710. For example, if embodiments of the disclosure where different functions are used in corresponding layers in different iterations, tables 705 and 710 may be organized by iteration and then by layer.

Figure 8:
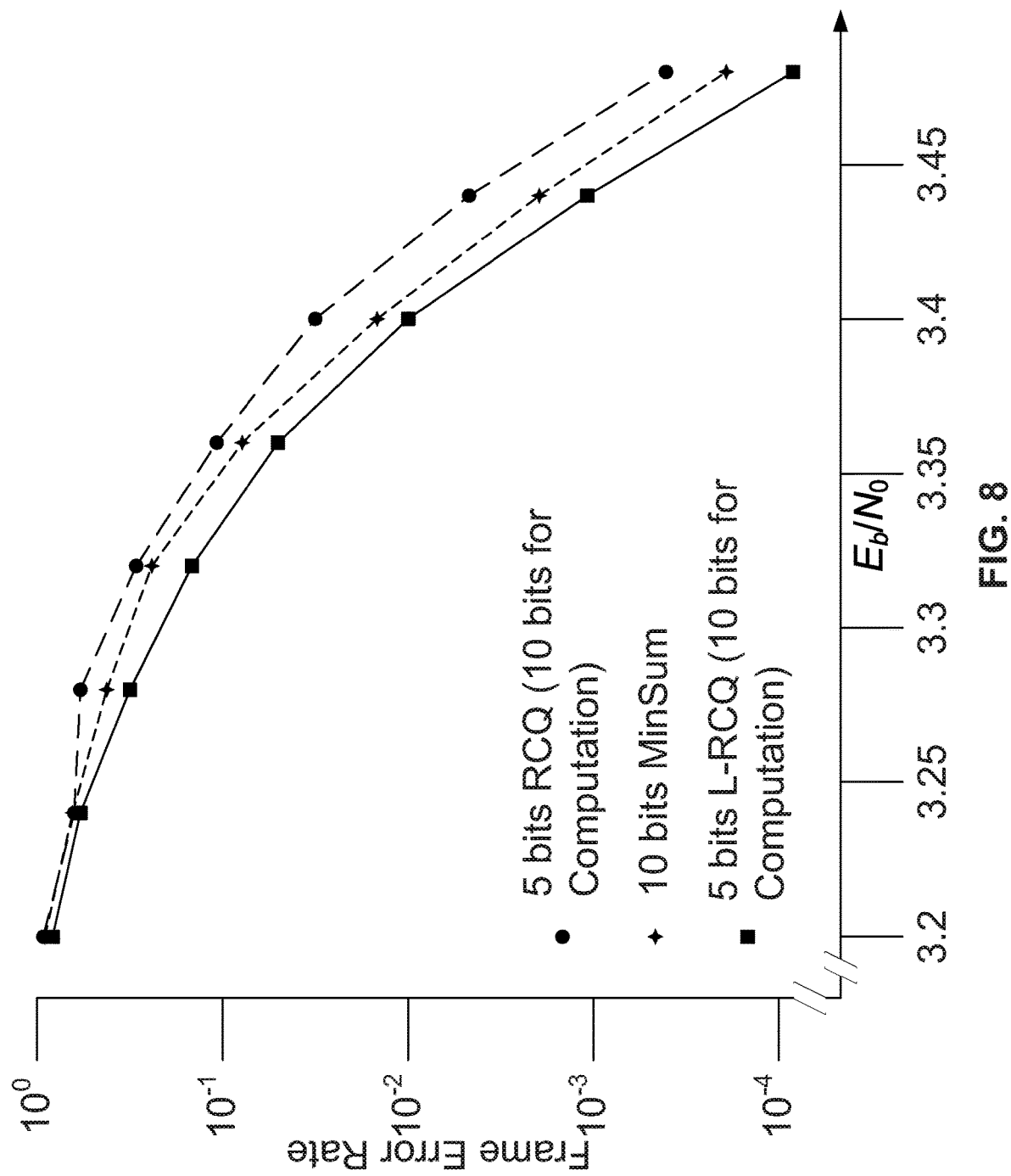
FIG. 8 shows a graph comparing error rates using the decoder of FIG. 4 with other decoders.

FIG. 8 shows a graph comparing error rates using decoder 420 of FIG. 4 with other decoders. In FIG. 8, decoder 420, identified as 5 bits L-RCQ, is compared with 5 bits RCQ and 10 bits MinSum. The graph of FIG. 8 may compare the frame error rate (FER) with the condition of the channel (represented as $E_b/N_0$. The larger the value of $E_b/N_0$, the cleaner the channel may be, which shows that the error rate may be low and the decoder may carry out decoding more easily. Given a target FER, a decoder that operates with a lower value for $E_b/N_0$ may be superior, as such a decoder may perform decoding even if the channel is noisier. As may be seen, the error rate for decoder 420 is consistently superior to the other decoders, even when compared to decoders using higher bit widths (for example, 10 bits MinSum).

Figure 9:
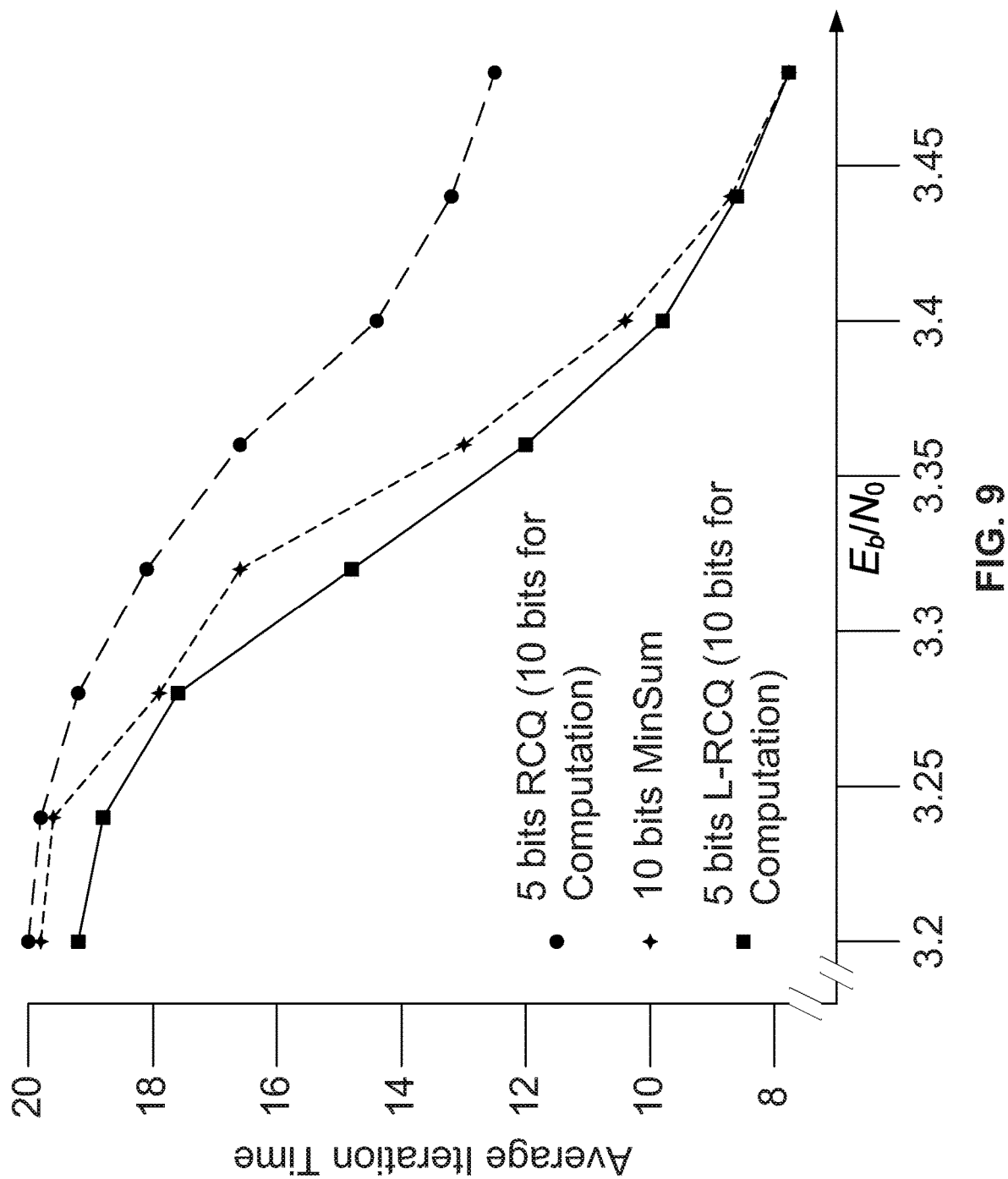
FIG. 9 shows a graph comparing the average iteration time using the decoder of FIG. 4 with other decoders.

FIG. 9 shows a graph comparing the average iteration time using decoder 420 of FIG. 4 with other decoders. In FIG. 9, average iteration time uses units of time, but may not be measured in seconds or fractions thereof: for example, average iteration time may be measured using processor cycles. As with FIG. 8, decoder 420 of FIG. 4 is at least as good as the other decoders (and offers superior average iteration time than 5 bits RCQ).

As can be seen from FIGS. 8-9, when decoder 420 of FIG. 4 is compared with 5 bits RCQ and 10 bits MinSum, decoder 420 of FIG. 4 is superior along at least one measure of performance.

Figure 10A:
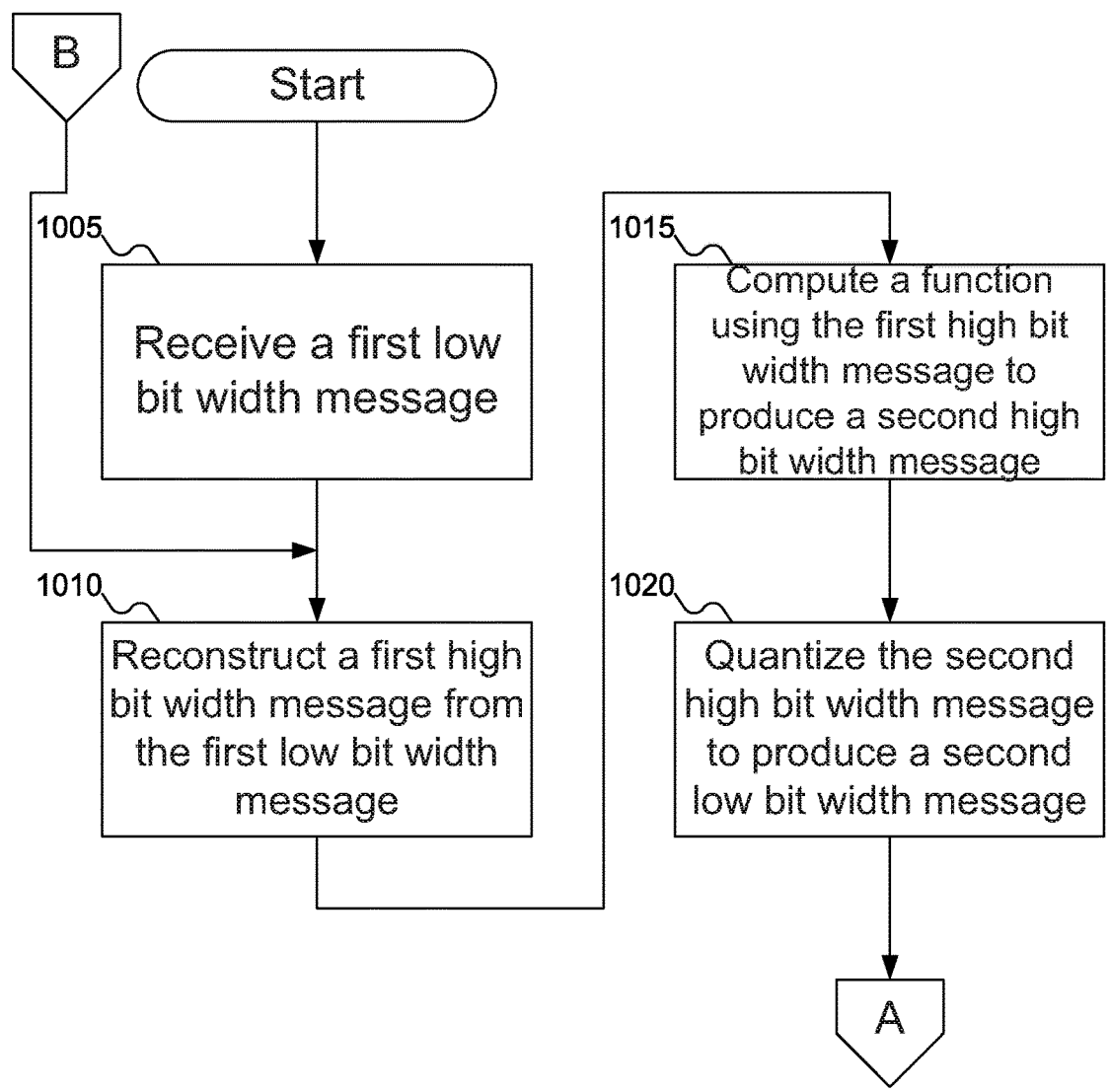
FIGS. 10A-10B show a flowchart of an example procedure for using the decoder of FIG. 6, according to embodiments of the disclosure.
Figure 10B:
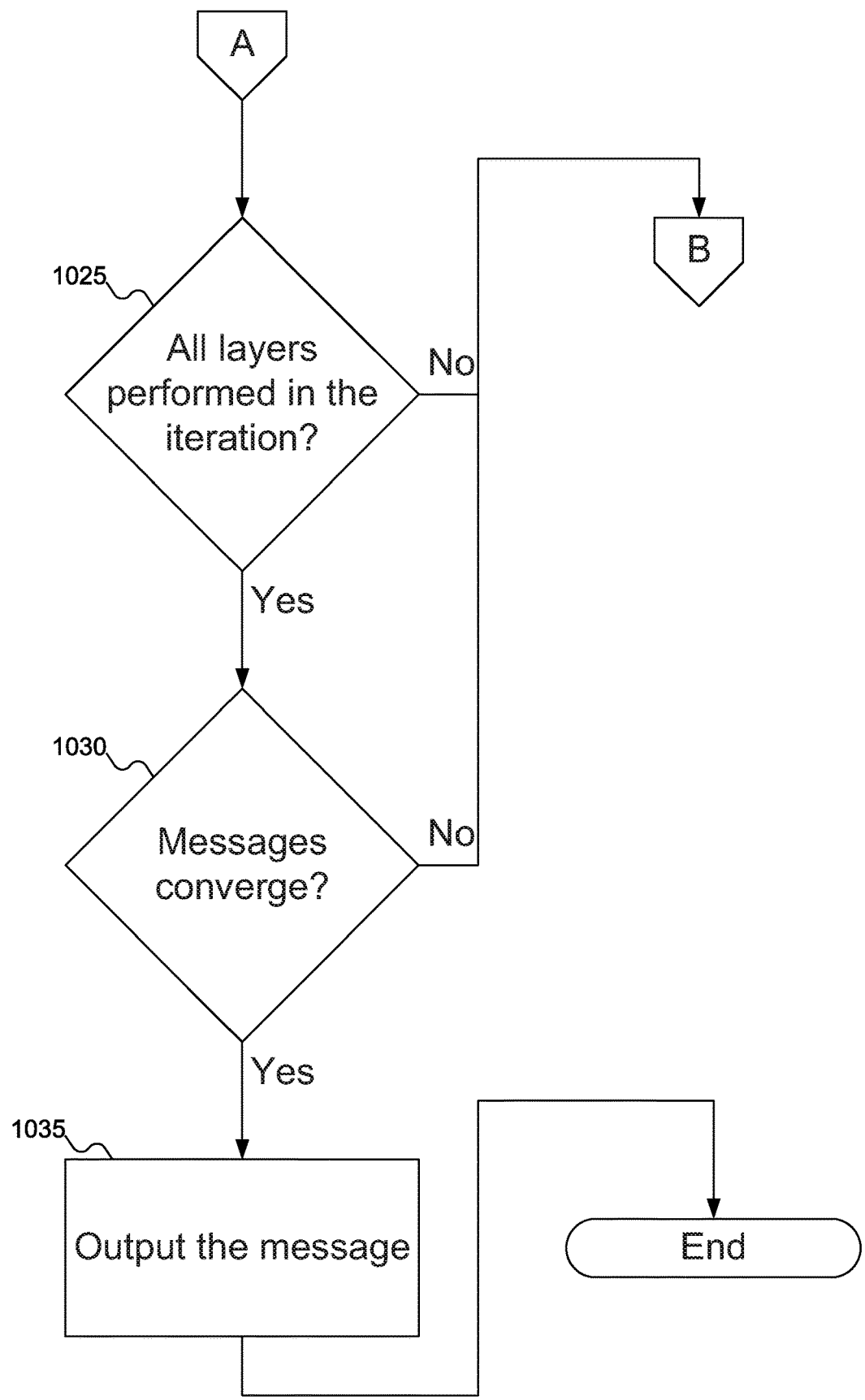

FIGS. 10A-10B show a flowchart of an example procedure for using the decoder of FIG. 6, according to embodiments of the disclosure. In FIG. 10A, at block 1005, decoder 420 of FIG. 4 may receive an input message, which may be a low bit width message. At block 1010, reconstruction circuit 510 of FIG. 5 may be used to construct a high bit width message from the low bit width message. At block 1015, computation circuit 520 of FIG. 5 may compute another high bit width message from the first high bit width message. At block 1020, quantization circuit 530 of FIG. 5 may quantize the high bit width message to a low bit width message.

At block 1025 (FIG. 10B), decoder 420 of FIG. 4 may check to see if all layers of an iteration have completed, and at block 1030, decoder 420 of FIG. 4 may check to see if, at the end of an iteration, decoder 420 of FIG. 4 has converged on a solution. If all layers are not complete, or if the messages have not converged on a solution, then processing may return to block 1010 for another layer/iteration. Otherwise, at block 1035, decoder 420 of FIG. 4 may output the final message.

In FIGS. 10A-10B, some embodiments of the disclosure are shown. But a person skilled in the art will recognize that other embodiments of the disclosure are also possible, by changing the order of the blocks, by omitting blocks, or by including links not shown in the drawings. Any of the components or any combination of the components described (for example, in the system diagrams) may be used to perform one or more of the operations of the flowcharts. The operations described above are example operations, and may involve various additional steps not explicitly covered. In addition, the temporal order of the operations may be varied. All such variations of the flowcharts are considered to be embodiments of the disclosure, whether expressly described or not.

Embodiments of the disclosure offer technical advantages over the prior art. The decoder implemented by using functions $R_v^{(l,i)}(\cdot)$ and $Q_v^{(l,i)}(\cdot)$ that vary with both layer and iteration may perform with an average iteration time that is at least equal to other decoders, and with a bit width that is at least equal to other decoders. While the decoder might not be superior to other decoders when considering only one criteria, when considering all criteria the decoder is superior to other decoders according to at least one criteria.

The following discussion is intended to provide a brief, general description of a suitable machine or machines in which certain aspects of the disclosure may be implemented. The machine or machines may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines may include embedded controllers, such as programmable or non-programmable logic devices or arrays, Application Specific Integrated Circuits (ASICs), embedded computers, smart cards, and the like. The machine or machines may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciate that network communication may utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present disclosure may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Embodiments of the disclosure may include a tangible, non-transitory machine-readable medium comprising instructions executable by one or more processors, the instructions comprising instructions to perform the elements of the disclosures as described herein.

The various operations of methods described above may be performed by any suitable means capable of performing the operations, such as various hardware and/or software component(s), circuits, and/or module(s). The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Having described and illustrated the principles of the disclosure with reference to illustrated embodiments, it will be recognized that the illustrated embodiments may be modified in arrangement and detail without departing from such principles, and may be combined in any desired manner. And, although the foregoing discussion has focused on particular embodiments, other configurations are contemplated. In particular, even though expressions such as "according to an embodiment of the disclosure" or the like are used herein, these phrases are meant to generally reference embodiment possibilities, and are not intended to limit the disclosure to particular embodiment configurations. As used herein, these terms may reference the same or different embodiments that are combinable into other embodiments.

The foregoing illustrative embodiments are not to be construed as limiting the disclosure thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this disclosure as defined in the claims.

Embodiments of the disclosure may extend to the following statements, without limitation:

Statement 1. An embodiment of the disclosure includes a device, comprising:
an input buffer to receive a first low bit width message;
a reconstruction circuit implementing a reconstruction function on the first low bit width message, producing a first high bit width message;
a computation circuit implementing a computation function on the first high bit width message, producing a second high bit width message;
a quantization circuit implementing a quantization function on the second high bit width message, producing a second low bit width message; and
a decision buffer to store the second low bit width message,
wherein the reconstruction function and the quantization function vary depending on at least one of an iteration and a layer of the device.

Statement 2. An embodiment of the disclosure includes the device according to statement 1, wherein the device is part of a linear block code circuit.

Statement 3. An embodiment of the disclosure includes the device according to statement 2, wherein the linear block code circuit is part of a storage device.

Statement 4. An embodiment of the disclosure includes the device according to statement 3, wherein the storage device includes a Solid State Drive (SSD).

Statement 5. An embodiment of the disclosure includes the device according to statement 1, wherein the device includes at least two layers.

Statement 6. An embodiment of the disclosure includes the device according to statement 5, wherein the reconstruction circuit, the computation circuit, and the quantization circuit are used for at least two layers in an iteration.

Statement 7. An embodiment of the disclosure includes the device according to statement 6, wherein:
the reconstruction circuit implementing the reconstruction function, the computation circuit, and the quantization circuit implementing the quantization function generate a first decoding; and
the reconstruction circuit implementing a second reconstruction function, the computation circuit, and the quantization circuit implementing a second quantization function generate a second decoding.

Statement 8. An embodiment of the disclosure includes the device according to statement 7, wherein, based at least on a comparison of the first decoding and the second decoding, the reconstruction circuit implementing a third reconstruction function, the computation circuit, and the quantization circuit implementing a third quantization function generate a third decoding.

Statement 9. An embodiment of the disclosure includes the device according to statement 7, wherein the reconstruction circuit implementing the reconstruction function, the computation circuit, and the quantization circuit implementing the quantization function generate the first decoding in a first layer; and
the reconstruction circuit implementing the second reconstruction function, the computation circuit, and the quantization circuit implementing the second quantization function generate the second decoding in a second layer.

Statement 10. An embodiment of the disclosure includes the device according to statement 7, wherein the reconstruction circuit implementing the reconstruction function, the computation circuit, and the quantization circuit implementing the quantization function generate the first decoding in a first iteration; and
the reconstruction circuit implementing the second reconstruction function, the computation circuit, and the quantization circuit implementing the second quantization function generate the second decoding in a second iteration.

Statement 11. An embodiment of the disclosure includes the device according to statement 6, wherein, based on at least a comparison of the first decoding and the second decoding, the second low bit width message is the first decoding.

Statement 12. An embodiment of the disclosure includes the device according to statement 6, wherein, based on at least a comparison of the first decoding and the second decoding, the second high bit width message is the first decoding.

Statement 13. An embodiment of the disclosure includes the device according to statement 1, wherein:
the reconstruction function is implemented using a first lookup table; and
the quantization function is implemented using a second lookup table.

Statement 14. An embodiment of the disclosure includes the device according to statement 13, wherein:
a storage device includes the device and a memory; and
the memory includes the first lookup table and the second lookup table.

Statement 15. An embodiment of the disclosure includes the device according to statement 1, wherein:
the reconstruction function is based on a density evolution technique; and
the quantization function is based on the density evolution technique.

Statement 16. An embodiment of the disclosure includes the device according to statement 1, wherein:
the first low bit width message is a first 5 bit message;
the second low bit width message is a second 5 bit message;
the first high bit width message is a first 10 bit message; and
the second high bit width message is a second 10 bit message.

Statement 17. An embodiment of the disclosure includes a method, comprising:
receiving a first low bit width message at a device;
reconstructing a first high bit width message from the first low bit width message using a reconstruction function;
computing a computation function on the first high bit width message to produce a second high bit width message; and
quantizing the second high bit width message to produce a second low bit width message using a quantization function,
wherein the reconstruction function and the quantization function vary depending on at least one of an iteration and a layer of the device.

Statement 18. An embodiment of the disclosure includes the method according to statement 17, further comprising repeating the reconstructing, computing, and quantizing operations for at least two layers in an iteration based at least in part on a comparison of the first decoding from a first layer and a second decoding from a second layer.

Statement 19. An embodiment of the disclosure includes the method according to statement 18, wherein the first decoding includes the first low bit width message and the second decoding includes the second low bit width message.

Statement 20. An embodiment of the disclosure includes the method according to statement 18, wherein the first decoding includes the first high bit width message and the second decoding includes the second high bit width message.

Statement 21. An embodiment of the disclosure includes the method according to statement 18, further comprising repeating the reconstructing, computing, and quantizing operations for at least two iterations based at least in part on a comparison of a first decoding from a first iteration and a second decoding from a second iteration.

Statement 22. An embodiment of the disclosure includes the method according to statement 21, wherein the first decoding includes the first low bit width message and the second decoding includes the second low bit width message.

Statement 23. An embodiment of the disclosure includes the method according to statement 21, wherein the first decoding includes the first high bit width message and the second decoding includes the second high bit width message.

Statement 24. An embodiment of the disclosure includes the method according to statement 17, further comprising:

outputting at least one of the second low bit width message or the second high bit width message from the device.

Statement 25. An embodiment of the disclosure includes the method according to statement 17, wherein the device is part of a linear block code circuit.

Statement 26. An embodiment of the disclosure includes the method according to statement 25, wherein the linear block code circuit is part of a storage device.

Statement 27. An embodiment of the disclosure includes the method according to statement 26, wherein the storage device includes a Solid State Drive (SSD).

Statement 28. An embodiment of the disclosure includes the method according to statement 17, wherein:

the reconstruction function is implemented using a first lookup table; and the quantization function is implemented using a second lookup table.

Statement 29. An embodiment of the disclosure includes the method according to statement 17, wherein:

the reconstruction function is based on a density evolution technique; and the quantization function is based on the density evolution technique.

Statement 30. An embodiment of the disclosure includes the method according to statement 17, wherein:

the first low bit width message is a first 5 bit message;

the second low bit width message is a second 5 bit message;

the first high bit width message is a first 10 bit message; and the second high bit width message is a second 10 bit message.

Statement 31. An embodiment of the disclosure includes an article, comprising a non-transitory storage medium, the non-transitory storage medium having stored thereon instructions that, when executed by a machine, result in:

receiving a first low bit width message at a device;

reconstructing a first high bit width message from the first low bit width message using a reconstruction function;

computing a computation function on the first high bit width message to produce a second high bit width message; and quantizing the second high bit width message to produce a second low bit width message using a quantization function, wherein the reconstruction function and the quantization function vary depending on at least one of an iteration and a layer of the device.

Statement 32. An embodiment of the disclosure includes the article according to statement 31, the non-transitory storage medium having stored thereon further instructions that, when executed by the machine, result in repeating the reconstructing, computing, and quantizing operations for at least two layers in an iteration based at least in part on a comparison of the first decoding from a first layer and a second decoding from a second layer.

Statement 33. An embodiment of the disclosure includes the article according to statement 32, wherein the first decoding includes the first low bit width message and the second decoding includes the second low bit width message.

Statement 34. An embodiment of the disclosure includes the article according to statement 32, wherein the first decoding includes the first high bit width message and the second decoding includes the second high bit width message.

Statement 35. An embodiment of the disclosure includes the article according to statement 32, the non-transitory storage medium having stored thereon further instructions that, when executed by the machine, result in repeating the reconstructing, computing, and quantizing operations for at least two iterations based at least in part on a comparison of a first decoding from a first iteration and a second decoding from a second iteration.

Statement 36. An embodiment of the disclosure includes the article according to statement 35, wherein the first decoding includes the first low bit width message and the second decoding includes the second low bit width message.

Statement 37. An embodiment of the disclosure includes the article according to statement 35, wherein the first decoding includes the first high bit width message and the second decoding includes the second high bit width message.

Statement 38. An embodiment of the disclosure includes the article according to statement 31, the non-transitory storage medium having stored thereon further instructions that, when executed by the machine, result in:

outputting at least one of the second low bit width message or the second high bit width message from the device.

Statement 39. An embodiment of the disclosure includes the article according to statement 31, wherein the device is part of a linear block code circuit.

Statement 40. An embodiment of the disclosure includes the article according to statement 39, wherein the linear block code circuit is part of a storage device.

Statement 41. An embodiment of the disclosure includes the article according to statement 40, wherein the storage device includes a Solid State Drive (SSD).

Statement 42. An embodiment of the disclosure includes the article according to statement 31, wherein:

the reconstruction function is implemented using a first lookup table; and the quantization function is implemented using a second lookup table.

Statement 43. An embodiment of the disclosure includes the article according to statement 31, wherein:
the reconstruction function is based on a density evolution technique; and
the quantization function is based on the density evolution technique.

Statement 44. An embodiment of the disclosure includes the article according to statement 31, wherein:
the first low bit width message is a first 5 bit message;
the second low bit width message is a second 5 bit message;
the first high bit width message is a first 10 bit message; and
the second high bit width message is a second 10 bit message.

Consequently, in view of the wide variety of permutations to the embodiments described herein, this detailed description and accompanying material is intended to be illustrative only, and should not be taken as limiting the scope of the disclosure. What is claimed as the disclosure, therefore, is all such modifications as may come within the scope and spirit of the following claims and equivalents thereto.

What is claimed is:

1. A device, comprising:
an input buffer to receive a first low bit width message;
a reconstruction circuit implementing a reconstruction function on the first low bit width message, producing a first high bit width message;
a computation circuit implementing a computation function on the first high bit width message, producing a second high bit width message;
a quantization circuit implementing a quantization function on the second high bit width message, producing a second low bit width message; and
a decision buffer to store the second low bit width message,
wherein the reconstruction function and the quantization function vary depending on at least one of an iteration and a layer of the device.

2. The device according to claim 1, wherein the device is part of a linear block code circuit.

3. The device according to claim 1, wherein the reconstruction circuit, the computation circuit, and the quantization circuit are used for at least two layers in an iteration.

4. The device according to claim 3, wherein:
the reconstruction circuit implementing the reconstruction function, the computation circuit, and the quantization circuit implementing the quantization function generate a first decoding; and
the reconstruction circuit implementing a second reconstruction function, the computation circuit, and the quantization circuit implementing a second quantization function generate a second decoding.

5. The device according to claim 4, wherein, based on at least a comparison of the first decoding and the second decoding, the second low bit width message is the first decoding.

6. The device according to claim 4, wherein the reconstruction circuit implementing the reconstruction function, the computation circuit, and the quantization circuit implementing the quantization function generate the first decoding in a first layer; and
the reconstruction circuit implementing the second reconstruction function, the computation circuit, and the quantization circuit implementing the second quantization function generate the second decoding in a second layer.

7. The device according to claim 4, wherein the reconstruction circuit implementing the reconstruction function, the computation circuit, and the quantization circuit implementing the quantization function generate the first decoding in a first iteration; and
the reconstruction circuit implementing the second reconstruction function, the computation circuit, and the quantization circuit implementing the second quantization function generate the second decoding in a second iteration.

8. The device according to claim 1, wherein:
the reconstruction function is implemented using a first lookup table; and
the quantization function is implemented using a second lookup table.

9. The device according to claim 8, wherein:
a storage device includes the device and a memory; and
the memory includes the first lookup table and the second lookup table.

10. The device according to claim 1, wherein:
the reconstruction function is based on a density evolution technique; and
the quantization function is based on the density evolution technique.

11. A method, comprising:
receiving a first low bit width message at a device;
reconstructing a first high bit width message from the first low bit width message using a reconstruction function;
computing a computation function on the first high bit width message to produce a second high bit width message; and
quantizing the second high bit width message to produce a second low bit width message using a quantization function,
wherein the reconstruction function and the quantization function vary depending on at least one of an iteration and a layer of the device.

12. The method according to claim 11, further comprising repeating the reconstructing, computing, and quantizing operations for at least two layers in an iteration based at least in part on a comparison of the first decoding from a first layer and a second decoding from a second layer.

13. The method according to claim 12, wherein the first decoding includes the first low bit width message and the second decoding includes the second low bit width message.

14. The method according to claim 12, further comprising repeating the reconstructing, computing, and quantizing operations for at least two iterations based at least in part on a comparison of a first decoding from a first iteration and a second decoding from a second iteration.

15. The method according to claim 14, wherein the first decoding includes the first low bit width message and the second decoding includes the second low bit width message.

16. The method according to claim 11, further comprising:
outputting at least one of the second low bit width message or the second high bit width message from the device.

17. The method according to claim 11, wherein:
the reconstruction function is implemented using a first lookup table; and
the quantization function is implemented using a second lookup table.

18. The method according to claim 11, wherein:
the reconstruction function is based on a density evolution technique; and the quantization function is based on the density evolution technique.

19. An article, comprising a non-transitory storage medium, the non-transitory storage medium having stored thereon instructions that, when executed by a machine, result in:
- receiving a first low bit width message at a device;
- reconstructing a first high bit width message from the first low bit width message using a reconstruction function;
- computing a computation function on the first high bit width message to produce a second high bit width message; and
- quantizing the second high bit width message to produce a second low bit width message using a quantization function,
- wherein the reconstruction function and the quantization function vary depending on at least one of an iteration and a layer of the device.

20. The article according to claim 19, wherein:
- the reconstruction function is based on a density evolution technique; and
- the quantization function is based on the density evolution technique.

\* \* \* \* \*